(12) United States Patent
Sekido et al.

(10) Patent No.: US 7,562,327 B2
(45) Date of Patent: Jul. 14, 2009

(54) MASK LAYOUT DESIGN IMPROVEMENT IN GATE WIDTH DIRECTION

(75) Inventors: Shinsaku Sekido, Osaka (JP); Kyoji Yamashita, Kyoto (JP); Katsuhiro Ootani, Nara (JP); Yasuyuki Sahara, Kyoto (JP); Daisaku Ikoma, Osaka (JP)

(73) Assignee: Panasonic Corporation, Osaka (JP)

( * ) Notice: Subject to any disclaimer, the term of this patent is extended or adjusted under 35 U.S.C. 154(b) by 229 days.

(21) Appl. No.: 11/591,452

(22) Filed: Nov. 2, 2006

(65) Prior Publication Data

US 2007/0141766 A1 Jun. 21, 2007

(30) Foreign Application Priority Data

Dec. 15, 2005 (JP) .............................. 2005-361370

(51) Int. Cl.
G06F 17/50 (2006.01)
(52) U.S. Cl. .................... 716/10; 716/8; 716/9; 716/11; 438/129; 438/154; 438/199; 438/207; 438/223; 438/313; 257/206
(58) Field of Classification Search ................ 716/8–11; 438/129, 154, 199, 207, 223, 313; 257/206
See application file for complete search history.

(56) References Cited

U.S. PATENT DOCUMENTS

| | | | | |
|---|---|---|---|---|
| 4,921,811 A | * | 5/1990 | Watanabe et al. | 438/207 |
| 5,903,036 A | * | 5/1999 | Onozawa | 257/390 |
| 6,156,605 A | * | 12/2000 | Song | 438/241 |
| 6,281,049 B1 | * | 8/2001 | Lee | 438/129 |
| 6,340,825 B1 | * | 1/2002 | Shibata et al. | 257/207 |
| 6,667,205 B2 | * | 12/2003 | Breitwisch et al. | 438/223 |
| 6,912,697 B2 | * | 6/2005 | Shibata et al. | 716/1 |
| 7,015,554 B2 | * | 3/2006 | Nakaoka et al. | 257/392 |
| 7,093,215 B2 | * | 8/2006 | Sahara et al. | 716/4 |
| 2003/0152873 A1 | * | 8/2003 | Tainaka et al. | 430/313 |
| 2004/0153986 A1 | * | 8/2004 | Sahara et al. | 716/10 |
| 2006/0259881 A1 | * | 11/2006 | Sahara et al. | 716/4 |
| 2007/0041144 A1 | * | 2/2007 | Szeto et al. | 361/272 |

OTHER PUBLICATIONS

Terence B. Hook, et al., "Lateral Ion Implant Straggle and Mask Proximity Effect," IEEE Transactions on Electron Devices, Sep. 2003, pp. 1946-1951, vol. 50, No. 9, IEEE.
"Accounting for Manufacturing Variation with Silicon Modeling," SoC/SiP Developer's Conference, May 5, 2005.

* cited by examiner

Primary Examiner—Naum B Levin
(74) Attorney, Agent, or Firm—McDermott Will & Emery LLP

(57) ABSTRACT

In a cell comprising an N well and a P well, a distance SP04 from a center line of a contact N-type region to an N well end of the N well is set to be a distance which causes a transistor not to be affected by resist. A distance from a well boundary to the center line of the contact N-type region is equal to SP04. A design on the P well is similar to that on the N well. Thereby, modeling of the transistor in the cell can be performed, taking into consideration an influence from resist in one direction. Also, by fabricating a cell array which satisfies the above-described conditions, design accuracy can be improved.

12 Claims, 8 Drawing Sheets

MASK LAYOUT DESIGN IMPROVEMENT IN GATE WIDTH DIRECTION

BACKGROUND OF THE INVENTION

1. Field of the Invention

The present invention relates to a semiconductor circuit device in which a number of MIS transistors are integrated, and a method for designing the semiconductor circuit device.

2. Description of the Related Art

In recent years, for example, in the field of LSIs, such as MIS semiconductor integrated circuits and the like, design specifications required for integrated circuits have become more diverse and complex with an increase in the fineness of a semiconductor element pattern, a packaging density, and the speed of an operation of semiconductor elements. In general, LSIs (Large Scale Integration) represented by microprocessors are each composed of a number of basic functional unit circuits called cells. In the cell, a number of elements, such as a MIS transistor, a capacitance, a resistance, and the like, are arranged. As the performance and packaging density of LSIs are increased, a circuit design of a cell for determining the performance of the LSI is becoming more important. CAD (Computer Aided Design) tools play a considerably important role in designing the cell circuit with high accuracy.

A circuit simulator is one of the CAD tools which are deeply involved with design accuracy. The circuit simulator performs circuit simulation with respect to a designed cell or LSI, assuming a circuit operation of a cell or an LSI which would be fabricated by the design, based on a net list including information about connection of elements (a transistor, a capacitance, a resistance, etc.), and information about properties of the elements (a transistor size, a capacitance value, a resistance value, etc.). For example, the net list can be extracted from the mask layout of a designed cell using an extraction device for circuits. Also, regarding information about characteristics of transistors, a number of electrical characteristic formulas (hereinafter referred to as transistor models) have been developed so as to reproduce complicated electrical characteristics of transistors on a circuit simulator with high accuracy. Also, in order to reproduce desired transistor characteristics using a transistor model, model parameters included in the transistor model need to be optimized, depending on the desired transistor characteristic (hereinafter referred to as "extraction of model parameters").

Hereinafter, a cell layout of a conventional semiconductor circuit device, and a transistor model used in design of a conventional cell will be described.

FIG. 10 is a diagram schematically illustrating a structure of an MIS transistor for describing the conventional transistor model. As illustrated in FIG. 10, the transistor model includes an active region Rt surrounded by an isolation region Ris, a gate electrode 1412 extending across the active region Rt into the isolation region Ris on both sides of the active region Rt, a source region 1414a and a drain region 1414b formed in regions located on both sides of the gate electrode 1412 of the active region Rt, and a channel region 1413 formed in a region located under the gate electrode 1412 of the active region Rt. As hatched with slanting lines in FIG. 10, the channel region 1413 of the MIS transistor is defined as an overlapping region between the active region Rt and the gate electrode 1412 in the transistor model. Also, in the transistor model, the current performance of the MIS transistor is determined based on a width W (channel width) and a length L (channel length) of the channel region 1413, an electrical resistance of the active region Rt, and a resistance (not shown) added to the active region Rt, and information about a layout around the transistor is not taken into consideration.

Next, a cell layout will be described with reference to FIG. 11. FIG. 11 illustrates an exemplary cell layout.

FIG. 11 is a plan view schematically illustrating an exemplary layout of a conventional cell 1100 provided in a portion of a semiconductor substrate. In the semiconductor substrate, an N well 1112 and a P well 1113 are provided, and are adjacent to each other via a well boundary 1101. In the N well 1112, a PMIS active region 1104 surrounded by an isolation region Ris is provided. The P well 1113 is provided with an NMIS active region 1105 surrounded by the isolation region Ris. In FIG. 11, one active region is provided in each of the N well 1112 and the P well 1113 as an example, though a considerably large number of active regions are provided in actual semiconductor circuit devices.

A gate 1108 of a P-type MIS transistor is provided on the PMIS active region 1104. A gate 1109 of an N-type MIS transistor is provided on the NMIS active region 1105. Note that, as is similar to well-known MIS transistors, each gate has a so-called insulating gate structure composed of a gate insulating film and a gate electrode, though not illustrated.

Regions located on sides of a gate in each active region are source and drain regions. When a voltage is applied between the source and drain regions, and a bias is applied to the gate, a channel region is formed in a region under the gate of each active region, and a current flows through the channel region.

In the cell 1100 of FIG. 11, a gap between an end in a gate width direction of the N well 1112 (hereinafter denoted as an "N well end 1101'") and a center line of a contact N-type region 1106 is represented by SP14, a gap between the center line of the contact N-type region 1106 and the PMIS active region 1104 is represented by SP03, a width of the PMIS active region 1104 is represented by SP02, a gap between the PMIS active region 1104 and the well boundary 1101 (i.e., the boundary between the N well 1112 and the P well 1113) is represented by SP01. Also, a gap between an end in a gate width direction of the P well 1113 (hereinafter denoted as a well end 1111'") and a center line of a contact P-type region 1107 is represented by SN14, a gap between the center line of the contact P-type region 1107 and the NMIS active region 1105 is represented by SN03, a width of the NMIS active region 1105 is represented by SN02, and a gap between the NMIS active region 1105 and the well boundary 1101 is represented by SN01. A cell region 1102 for the P-type MIS transistor is hatched with right-slanting lines having large widths (SP01+SP02+SP03), and a cell region 1103 for the N-type MIS transistor is hatched with left-slanting lines having large widths (SN01+SN02+SN03). Regions on sides of the gate 1108 of the PMIS active region 1104 and the contact P-type region 1107 include a P-type impurity, and regions on sides of the gate 1109 of the NMIS active region 1105 and the contact N-type region 1106 include an N-type impurity.

FIGS. 1A and 1B are diagrams schematically illustrating a step of performing ion implantation using a resist as a mask when a MIS transistor is fabricated. In this step, in order to selectively perform required implantation, a portion into which ions are not to be implanted is covered with a resist film so that impurity ions are implanted into only a required portion. In FIGS. 1A and 1B, since ion implantation is performed with respect to only a PMIS region, a resist is formed on an NMIS region before ion implantation is performed. Typically, as illustrated in FIG. 1A, ideally, a predetermined amount of impurity ions are implanted into a portion which is not covered with the resist. In fact, however, as illustrated in FIG. 1B, impurity ions implanted into the resist are scattered by polymers included in the resist, so that the direction of the implantation is changed (resist scatter), or when the implantation angle is not 0 degrees, or even when the implantation angle is 0 degrees, there are probabilistically ions having an angle which is not 0 degrees, such ions strike a side wall of the resist, so that ions are reflected at some constant rate (resist reflection). These phenomena lead to an effective increase in dose, so that driving force is reduced due to an increase in threshold voltage.

FIG. 2 is a diagram illustrating a change in transistor characteristics when a value of SP01+SP02 is changed in the CMOS transistor of FIG. 11. The vertical axis represents ΔVth which is a difference between a threshold value of a subject transistor and a threshold value of an N-type MIS transistor or a P-type MIS transistor provided alone. Here, a result of simulation with respect to the P-type MIS transistor is shown. In the P-type MIS transistor, it is assumed that a resist is not formed on the N well end 1101' side (a resist is formed on the well boundary 1101 side). The gate width of the P-type MIS transistor is assumed to be constant.

As can be seen from the result of FIG. 2, in the CMOS transistor, when a transistor is provided at a location close to the well boundary 1101, the threshold value voltage increases. In FIG. 2, it may be considered that a P-type MIS transistor formed alone corresponds to a point of SP01+SP02=1 μm.

In summary, as can be seen from the result of the simulation conducted by the present inventors, the performance of semiconductor circuit devices including a recent miniaturized MIS transistor varies, depending on how much the MIS transistor is distant from the well boundary as well as the gate length and the gate width of the MIS transistor. What has been described above is also described in "Lateral Ion Implant Straggle and Mask Proximity Effect", IEEE Transaction on Electron Devices, Vol. 50, No. 9, September 2003.

Semiconductor circuit devices can be designed using a method described in "Accounting for Manufacturing Variation with Silicon Modeling", SoC/SiP Developer's Conference, May 5, 2005 described below.

Note that FIG. 12 is a plan view illustrating a semiconductor circuit device in which cells designed by the conventional method are arranged in an array. In this semiconductor circuit device, N wells 1212 and P wells 1213 are alternately arranged in a length direction (gate width direction). A cell region 1202 for a P-type MIS transistor and a cell region 1203 for an N-type MIS transistor correspond to the cell region 1102 for a P-type MIS transistor and the cell region 1103 for an N-type MIS transistor of FIG. 11. The N well 1212 and the P well 1213 correspond to the N well 1112 and the P well 1113 of FIG. 11. A well boundary 1201 which is a boundary between the N well 1212 and the P well 1213 corresponds to the well boundary 1101 of FIG. 11. An N well end 1201' corresponds to the N well end 1101' of FIG. 11.

SUMMARY OF THE INVENTION

As illustrated in FIG. 12, standard cells are generally arranged in an array. However, since the characteristics of a transistor vary depending on a distance from the well boundary 1201 or the N well end 1201', there is a difference in characteristics between outermost cells and inner cells in the array. Therefore, it is difficult to maintain high the design accuracy of semiconductor circuit devices.

An object of the present invention is to solve the above-described problem and provide a method for designing a semiconductor circuit device without an influence of a distance from a well end of a MIS transistor.

A first semiconductor circuit device according to the present invention is provided in which a plurality of cells are arranged in an array in a cell array formation region, each cell having a first conductivity type MIS transistor and a second conductivity type MIS transistor. In the cell array formation region, a plurality of first conductivity type first wells and a plurality of second conductivity type second wells are alternately arranged in a gate width direction. Of the first wells and the second wells, a distance between an outer end portion of an outermost well in the gate width direction in the cell array formation region, and an active region formed in the outermost well, is set to be larger than or equal to a predetermined value.

In this configuration, for example, when a distance which is sufficient for suppression of influences of reflection and scatter from a resist is calculated based on a desired design rule, and the distance between the outer end portion of the outermost well and the active region formed in the outermost cell is set to be larger than or equal to the calculated distance, the MIS transistor formed in the active region is no longer affected by a resist from an end portion in the gate width direction of the cell array formation region. Therefore, it is possible to suppress a degradation in transistor characteristics. Also, it is possible to suppress a degradation in characteristics of transistors formed in a semiconductor circuit device.

The predetermined value may be 1 μm.

A second semiconductor circuit device according to the present invention is provided in which a plurality of cells are arranged in an array, each cell having an N well and a P well formed in a substrate, a first PMIS active region formed in the N well, a first P-channel type transistor formed on the first PMIS active region and having a gate electrode, a first NMIS active region formed in the P well, a first N-channel type transistor formed on the first NMIS active region and having a gate electrode, a contact N-type region formed in the N well, and a contact P-type region formed in the P well. A distance from a boundary line between the N well and the P well to an end portion in a gate width direction of the N well, is one time or more and two times or less larger than a distance from the boundary line to a center line of the contact N-type region. A distance from the boundary line to an end portion in the gate width direction of the P well is one time or more and two times or less larger than a distance from the boundary line to a center line of the contact P-type region.

A first method for designing a semiconductor circuit device according to the present invention is a method for designing the above-described semiconductor circuit device of the present invention. The method comprises the steps of (a) preparing the cells, and (b) arranging the cells in an array in the cell array formation region.

According to this method, a semiconductor circuit device can be readily designed using an existing design tool.

A second method for designing a semiconductor circuit device according to the present invention, comprises the steps of (a) preparing cells each having an N well and a P well formed in a substrate, a PMIS active region formed in the N well, a P-type transistor formed on the PMIS active region and having a gate electrode, an NMIS active region formed in the P well, and an N-type transistor formed on the NMIS active region and having a gate electrode, (b) fabricating a cell array by arranging the cells in an array, and (c) adding a dummy region to a cell located at an end portion in a gate width direction of the cell array fabricated in step (b).

DETAILED DESCRIPTION OF THE PREFERRED EMBODIMENTS

First Embodiment

Figure 3:
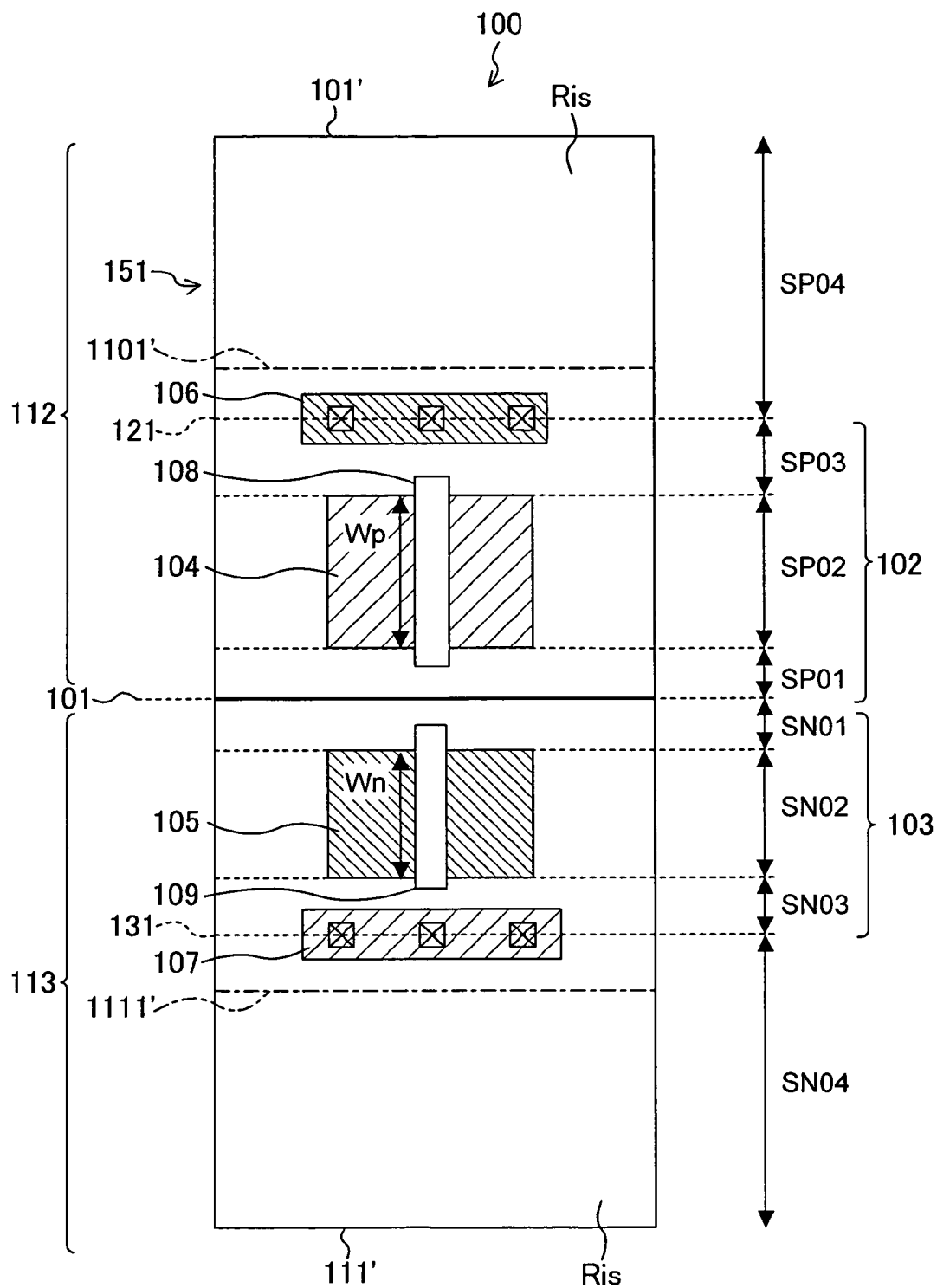
FIG. 3 is a plan view schematically illustrating a cell layout of a semiconductor circuit device according to a first embodiment of the present invention.

FIG. 3 is a plan view schematically illustrating a cell layout of a semiconductor circuit device according to a first embodiment of the present invention.

As illustrated in FIG. 3, in a semiconductor substrate, an N well 112 and a P well 113, which are adjacent to each other at well boundary 101, are provided. A PMIS active region 104 surrounded by an isolation region Ris, and a contact N-type region 106 for an N-well contact are provided in the N well 112. An NMIS active region 105 surrounded by the isolation region Ris, and a contact P-type region 107 for a P-well contact are provided in the P well 113. A gate 108 of a P-channel type transistor is provided on the PMIS active region 104. A gate 109 of an N-channel type transistor is provided on the NMIS active region 105. Note that, as is similar to well-known transistors, each gate has a so-called insulating gate structure composed of a gate insulating film and a gate electrode, though not illustrated. A circumference of the P well 113 excluding the well boundary 101 is referred to as a well frame 151. Of the well frame 151, an end in a gate width direction of the N well 112 is referred to as an N well end 101', an end in the gate width direction of the P well 113 is referred to as a P well end 111'. A cell region 102 for the P-type MIS transistor is hatched with right-slanting lines having large widths (SP01+SP02+SP03), and a cell region 103 for the N-type MIS transistor is hatched with left-slanting lines having large widths (SN01+SN02+SN03). A P-type impurity is contained in source and drain regions located on both sides of the gate 108 in the PMIS active region 104, and an N-type impurity is contained in the contact N-type region 106. An N-type impurity is contained in source and drain regions located on both sides of the gate 109 in the NMIS active region 105, and a P-type impurity is contained in the contact P-type region 107. Note that the term "gate width direction" as used herein refers to a direction in which the gate electrode of each transistor extends, and the term "gate length direction" as used herein refers to a direction which is perpendicular to the gate width direction, and in which carriers travel in a transistor channel.

A distance from the well boundary 101 to the PMIS active region 104 is represented by SP01. A length in the gate width direction (gate width) of the PMIS active region 104 is represented by Wp or SP02. A gap from the PMIS active region 104 to a center line 121 of the contact N-type region 106 is represented by SP03. A gap from the center line 121 of the contact N-type region 106 to the N well end 101' is represented by SP04. A distance from the well boundary 101 to the NMIS active region 105 is represented by SN01. A length in the gate width direction of the NMIS active region 105 is represented by Wn or SN02. A gap between the NMIS active region 105 to a center line 131 of the contact P-type region 107 is represented by SN03. A gap from the center line 131 of the contact P-type region 107 to the P well end 111' is represented by SN04.

Figure 11:
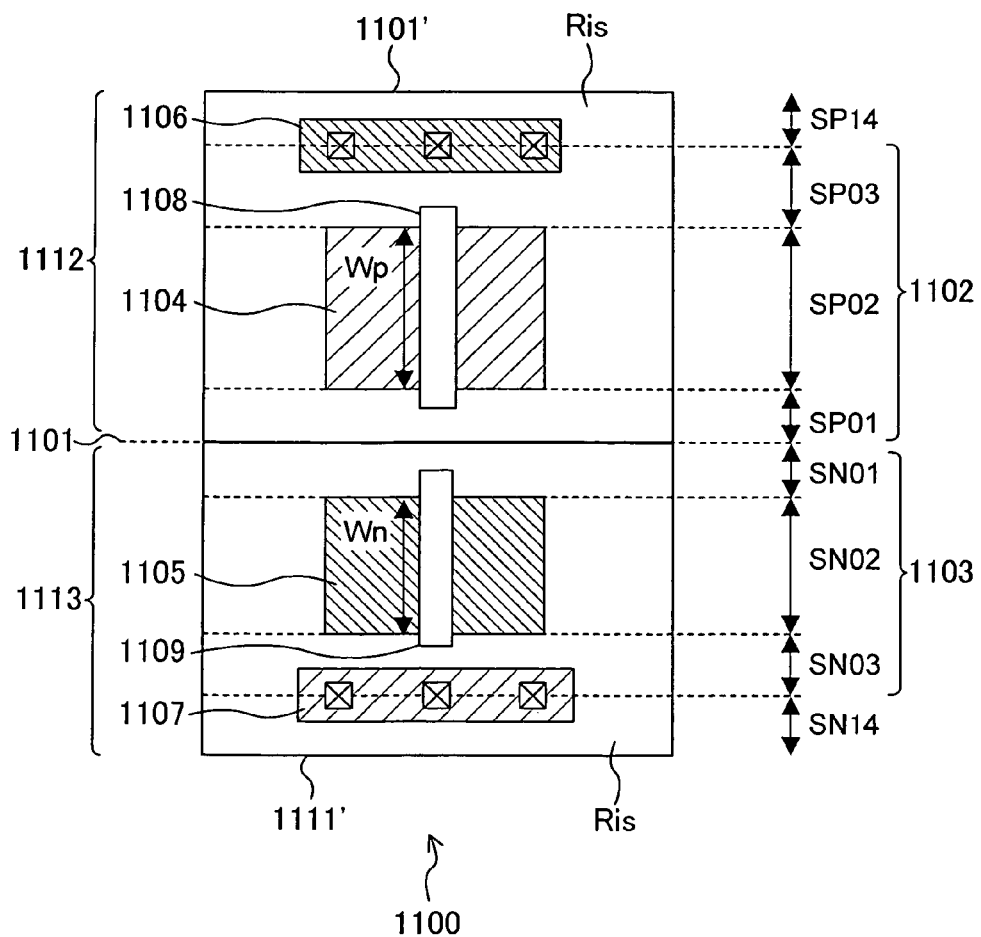
FIG. 11 is a plan view schematically illustrating an exemplary layout of a conventional cell provided in a portion of a semiconductor substrate.

As compared to the conventional cell of FIG. 11, both the N well 112 and the P well 113 of the cell 100 of this embodiment are larger than the corresponding ones of the conventional cells. Specifically, in FIGS. 3 and 11, SP14<SP04 and SN14<SN04. In FIG. 3, the locations of the N well end 1101' and the P well end 1111' of the conventional cell of FIG. 11 are indicated as reference with dash-dot lines.

Also, in FIG. 3, the contact N-type region 106 and the contact P-type region 107 are arranged with the respective longer sides extending in the gate length direction (an X direction of FIG. 3). The contact N-type region 106 and the contact P-type region 107 may be provided at any places within the N well 112 and the P well 113, respectively.

Although one active region is provided in each of the N well 112 and the P well 113 in FIG. 3, a considerably large number of active regions are provided in actual semiconductor circuit devices.

Figure 1A:
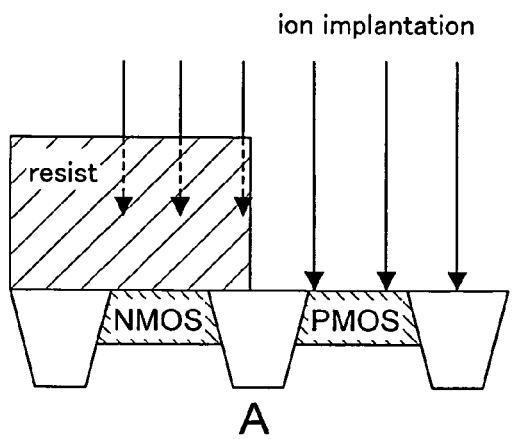
FIGS. 1A and 1B are diagrams schematically illustrating a step of performing ion implantation using a resist as a mask when a transistor is fabricated.
Figure 1B:
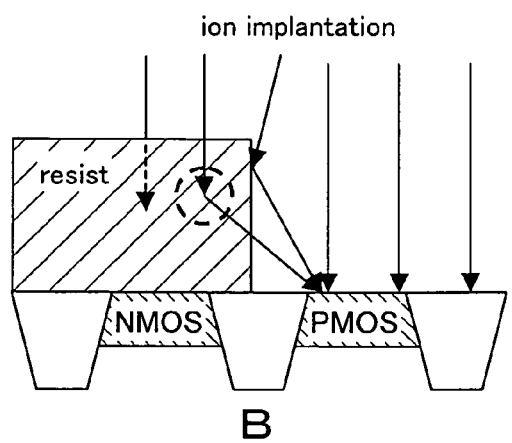
Figure 2:
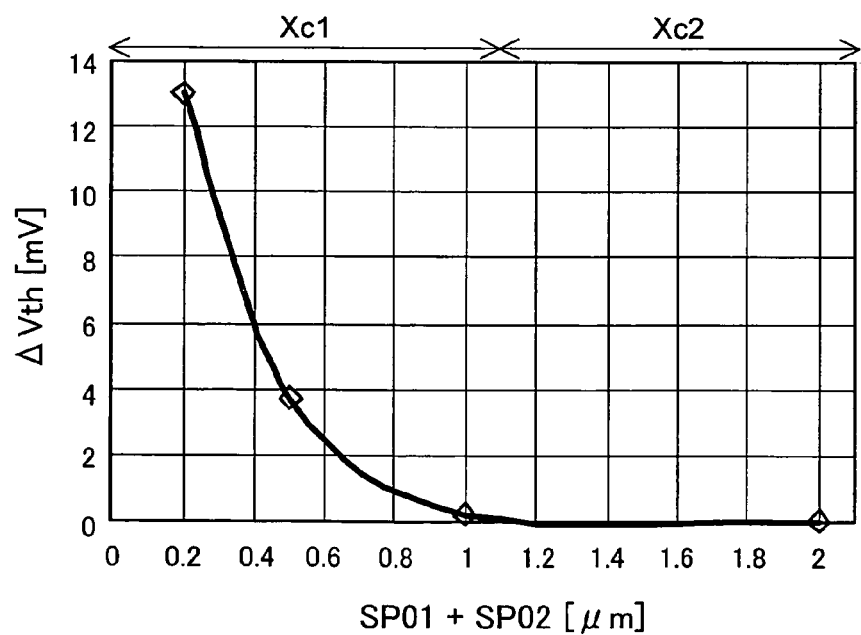
FIG. 2 is a diagram illustrating a change in transistor characteristics when a value of SP01+SP02 is changed in a CMOS transistor of FIG. 11.

In the cell 100 of this embodiment, SP03+SP04 desirably has a value of 1 μm or more. As described with reference to FIG. 2, when a transistor is formed excessively close to the well boundary 101, there is an influence on characteristics of the formed transistor. Note that the simulation result of FIG. 2 is of a certain process generation (e.g., a gate length is 65 nm or 100 nm), and a distance at which there is an influence from a resist varies depending on the process generation or the like. Specifically, the distance at which there is an influence from a resist is determined based on a material, a height of the resist, an angle and an energy of ion implantation. The value may be obtained by experimentation using a TEG (Test Element Group) or by simulation. According to the result of FIG. 2, a distance Xc1 from the well boundary at which there is an influence from a resist is in the range of less than 1 μm, and a distance Xc2 from the well boundary at which there is not an influence from a resist is 1 μm or more.

In the cell 100 of this embodiment, since SP03+SP04 and SN03+SN04 are each assumed to be 1 μm or more, the P-type MIS transistor on the PMIS active region 104 and the N-type MIS transistor on the NMIS active region 105 of FIG. 3 can be caused to be affected by only one of a pair of the well boundaries 101. Thereby, modeling can be performed, taking into consideration dependency on a well in only one direction.

Note that, in FIG. 3, when a resist is formed in leftward and rightward directions (X direction) of a transistor, the well frame 151 may be extended to the left and the right so that the length in the X direction is increased. Thereby, an influence of the resist provided in the leftward and rightward directions can be reduced.

The case where one CMOS transistor is provided has been described above. Next, a case where two ore more CMOS transistors are provided will be described.

Figure 4:
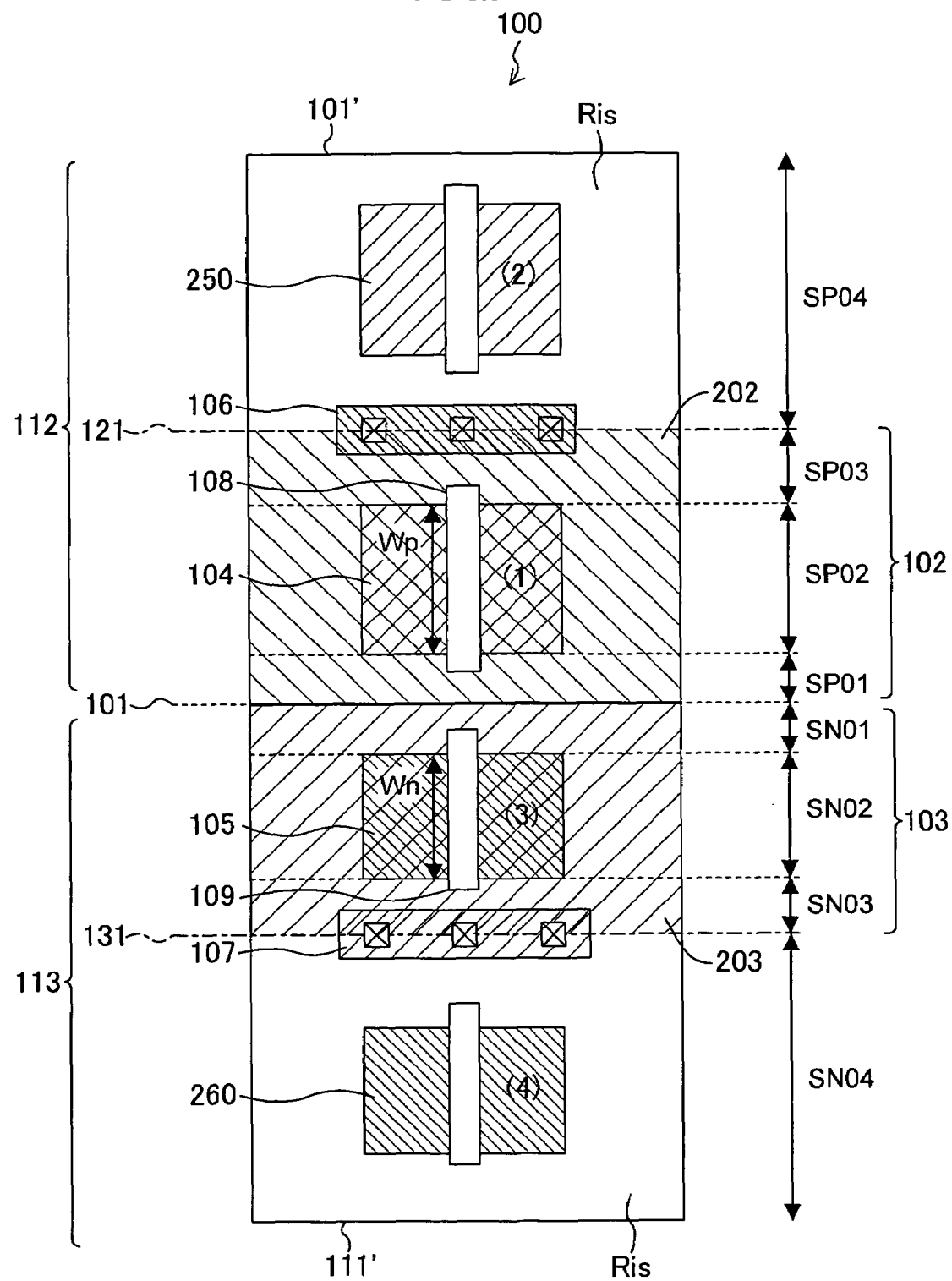
FIG. 4 is a plan view schematically illustrating a cell layout of a semiconductor circuit device of the first embodiment, in which two CMOS transistors are provided.

FIG. 4 is a plan view schematically illustrating a cell layout of a semiconductor circuit device of this embodiment, in which two CMOS transistors are provided. As illustrated in FIG. 4, when two or more CMOS transistors are provided in the length direction (gate width direction), a PMIS active region 250 is provided, the PMIS active region 250 and the PMIS active region 104 sandwiching the contact N-type region 106, and a P-type MIS transistor is formed on the PMIS active region 250. An NMIS active region 260 is provided, the NMIS active region 260 and the NMIS active region 105 sandwiching the contact P-type region 107, and an N-type MIS transistor is formed on the NMIS active region 260.

In this cell, a distance from the N well end 101' to the well boundary 101 is desirably two times or less (more than one time) larger than a distance from the well boundary 101 to a contact formed on the contact N-type region 106. Also, SP03+SP04 is desirably 1 μm or more.

Similarly, a distance from the P well end 111' to the well boundary 101 is desirably two times or less (more than one time) larger than a distance from the well boundary 101 to a contact formed on the contact P-type region 107. Also, SN03+SN04 is desirably 1 μm or more. In the example of FIG. 4, SP04=SP01+SP02+SP03 and SN04=SN01+SN02+SN03.

Thereby, a P-type MIS transistor ((1) of FIG. 4) on the PMIS active region 104 and an N-type MIS transistor ((3) of FIG. 4) on the NMIS active region 105 are affected by the resist from the well boundary 101, and are not affected by a resist from the N well end 101' or the P well end 111'. A P-type MIS transistor ((2) of FIG. 4) on the PMIS active region 250 and an N-type MIS transistor ((4) of FIG. 4) on the NMIS active region 260 are affected by the resist from the N well end 101' or the P well end 111', and are not affected by the resist from the well boundary 101. Therefore, by arranging the cells of this embodiment, characteristics of transistors can be caused to be uniform in a semiconductor circuit device. Thus, even when two or more CMOS transistors are provided, modeling can be performed, taking into consideration a change in characteristics due to a well in only one direction.

Second Embodiment

Figure 5A:
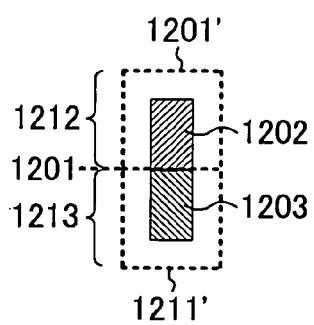
FIGS. 5A to 5E are diagrams for describing a method of arranging cells in an array in a semiconductor circuit device.
Figure 5B:
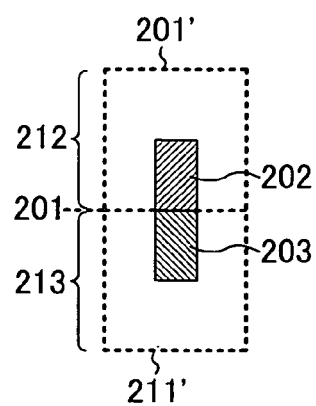
Figure 5C:
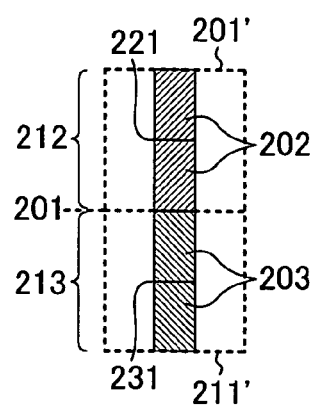
Figure 5D:
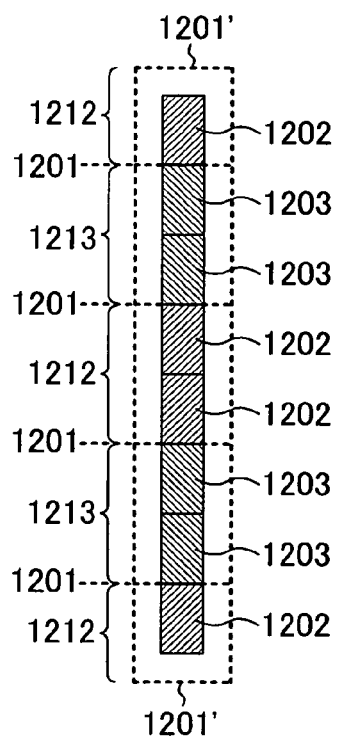
Figure 5E:
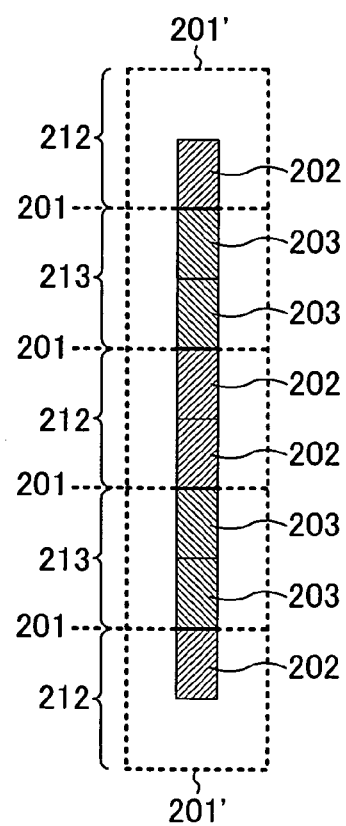
Figure 6:
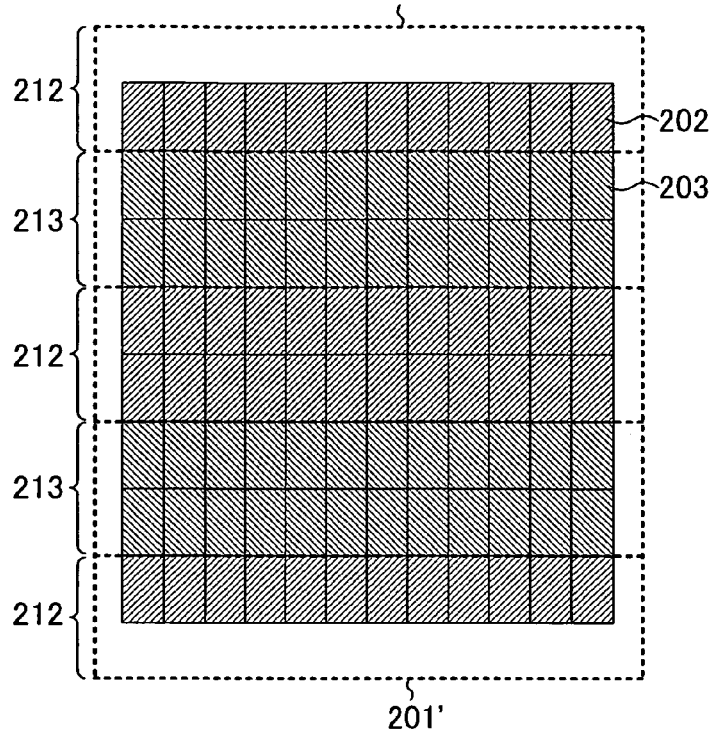
FIG. 6 is a plan view schematically illustrating a cell array layout of a semiconductor circuit device according to a second embodiment of the present invention.
Figure 7:
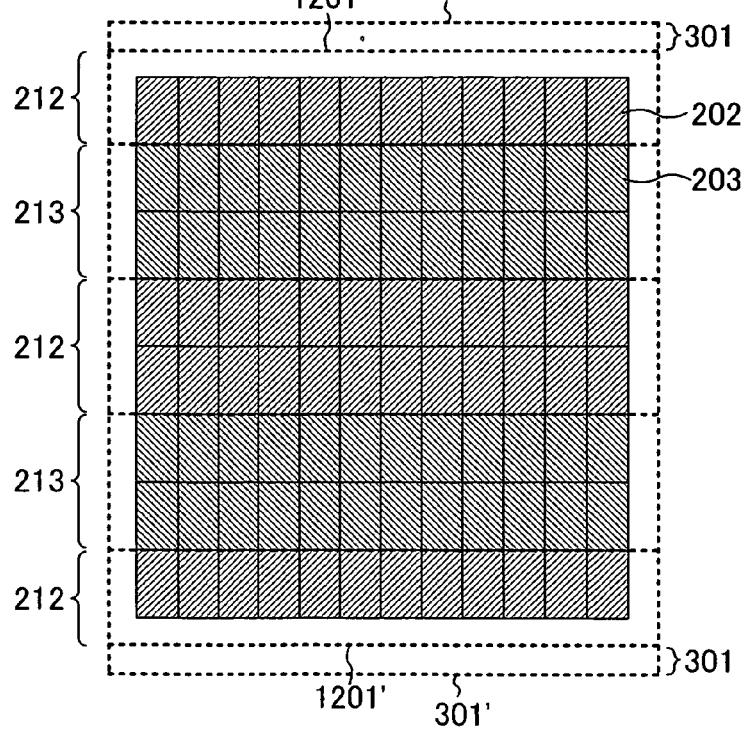
FIG. 7 is a plan view schematically illustrating another cell array layout of the semiconductor circuit device of the second embodiment.

FIG. 6 is a plan view schematically illustrating a cell array layout of a semiconductor circuit device according to a second embodiment of the present invention. FIGS. 5A to 5E are diagrams for describing a method of arranging cells in an array in a semiconductor circuit device. Note that FIG. 7 is a plan view schematically illustrating another cell array layout of the semiconductor circuit device of this embodiment, which is different from that of FIG. 6.

Firstly, a definition of a cell region and a method of arranging cells in an array will be described with reference to FIGS. 5A to 5E. FIG. 5A schematically illustrates FIG. 11. FIG. 5B schematically illustrates FIG. 3. FIG. 5C schematically illustrates FIG. 4. In FIG. 5D, cells each of which is the conventional cell of FIG. 5A are arranged in the length direction. In FIG. 5E, cells of the first embodiment of FIG. 5B are arranged in the length direction. In these diagrams, cell regions 202 and 1202 for P-type MIS transistors are hatched with left-slanting lines, and cell regions 203 and 1203 for N-type MIS transistors are hatched with right-slanting lines. Here, a cell region for a transistor refers to a region of a cell which extends from a well boundary to a center line of a contact impurity region (a contact N-type region or a contact P-type region), and includes an active region in which the transistor is formed, and an isolation region surrounding the active region.

Firstly, the conventional cells of FIG. 5A will be described. In the conventional cell array, adjacent cell regions overlap each other at a boundary therebetween. In general, cell regions have the same height (a length in a Y direction) in all cells, and the cell regions have widths (a length in the X direction) varying from cell to cell. Here, a cell region 1202 for a P-type MIS transistor and a cell region 1203 for an N-type MIS transistor correspond to the P-type MIS transistor cell region 1102 and the N-type MIS transistor cell region 1103 of FIG. 11, respectively. An N well 1212 and a P well 1213 correspond to the N well 1112 and the P well 1113 of FIG. 11, respectively. A well boundary 1201, an N well end 1201', and a P well end 1211' correspond to the well boundary 1101, the N well end 1101', and the P well end 1111' of FIG. 11, respectively.

On the other hand, in the cell of the first embodiment of FIG. 5B, a distance between a cell region 202 for a P-type MIS transistor and an N well end 201' is larger than that of the conventional cell, and a distance between a cell region 203 for an N-type MIS transistor and a P well end 211' is also larger than that of the conventional cell. Here, the P-type MIS transistor cell region 202 and the N-type MIS transistor cell region 203 correspond to the P-type MIS transistor cell region 102 and the N-type MIS transistor cell region 103 of FIG. 3. Also, an N well 212 and a P well 213 correspond to the N well 112 and the P well 113 of FIG. 3. A well boundary 201, the N well end 201', and the P well end 211' correspond to the well boundary 101, the N well end 101', and the P well end 111' of FIG. 3.

In the cell of the first embodiment of FIG. 5C, two cell regions 202 for P-type MIS transistors are provided in the gate width direction in an N well 212, and two cell regions 203 for N-type MIS transistors are provided in the gate width direction in a P well 213. Here, the P-type MIS transistor cell region 202 and the N-type MIS transistor cell region 203 correspond to the P-type MIS transistor cell region 102 and the N-type MIS transistor cell region 103 of FIG. 4, respectively. The N well 212 and the P well 213 correspond to the N well 112 and the P well 113 of FIG. 4, respectively. A well boundary 201, an N well end 201', and a P well end 211' correspond to the well boundary 101, the N well end 101', and the P well end 111' of FIG. 4, respectively. A boundary line 221 between the two P-type MIS transistor cell regions 202 and a boundary line 231 between the two N-type MIS transistor cell regions 203 correspond to the center line 121 of the contact N-type region 106 and the center line 131 of the contact P-type region 107 of FIG. 4, respectively.

In a typical semiconductor circuit design, as illustrated in FIG. 4, the P-type MIS transistor (1) on the PMIS active region 104 is provided by flipping the P-type MIS transistor (2) on the PMIS active region 250 using the center line 121 of the contact N-type region 106 (X axis) as a boundary, or vice versa. The N-type MIS transistor (3) on the NMIS active region 105 is provided by flipping the N-type MIS transistor (4) on the NMIS active region 260 using the center line 131 of the contact P-type region 107 (X axis) as a boundary, or vice versa.

Note that, when a distance from the N well end 101' to the well boundary 101 is more than two times larger than a distance from the well boundary 101 to a contact formed on the contact N-type region 106, the flipped N well and P well overlap. Therefore, the distance from the N well end 101' to the well boundary 101 is caused to be two times or less (more than one time) than the distance from the well boundary 101 to the contact formed on the contact N-type region 106. Also, when a distance from the P well end 111' to the well boundary 101 is more than two times larger than a distance from the well boundary 101 to a contact formed on the contact P-type region 107, the flipped N well and P well overlap. Therefore, the distance from the P well end 111' to the well boundary 101 is caused to be two times or less (more than one time) larger than the distance from the well boundary 101 to the contact formed on the contact P-type region 107.

Figure 12:
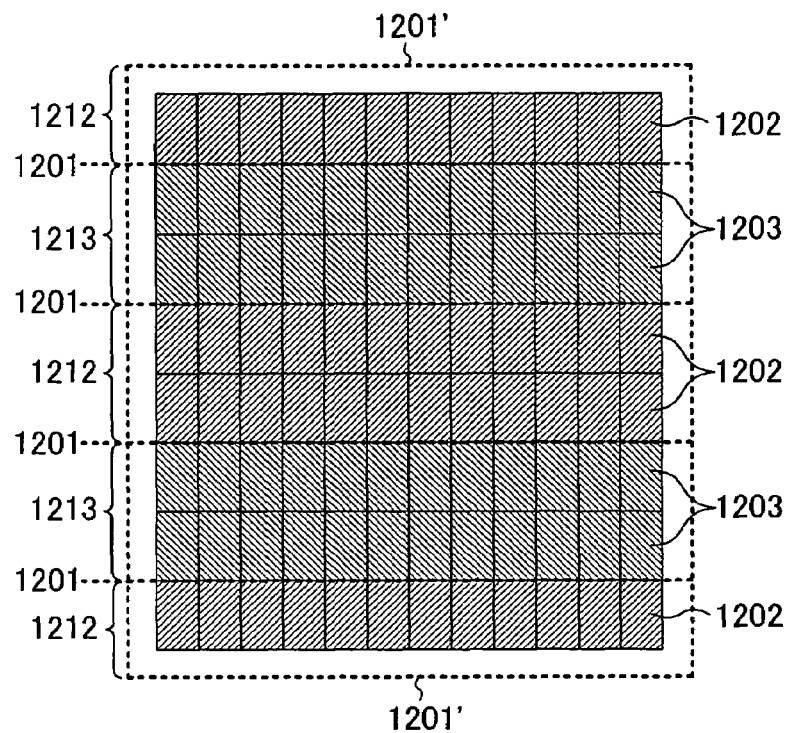
FIG. 12 is a plan view illustrating a semiconductor circuit device in which cells designed by a conventional method are arranged in an array.

In FIG. 5D, cells each of which is the conventional cell of FIG. 5A are arranged in the length direction in order of PMIS-NMIS-NMIS-PMIS-PMIS-NMIS-NMIS-PMIS. When cell arrays each of which is the cell array of FIG. 5D are further arranged in a lateral direction, a cell array is obtained as illustrated in FIG. 12.

In FIG. 5E, cells of the first embodiment of FIG. 5B are arranged in the length direction in order of PMIS-NMIS-NMIS-PMIS-PMIS-NMIS-NMIS-PMIS. When cell arrays each of which is the cell array of FIG. 5E are further arranged in a lateral direction, the cell array of the semiconductor circuit device of this embodiment in FIG. 6 is obtained.

Figure 8:
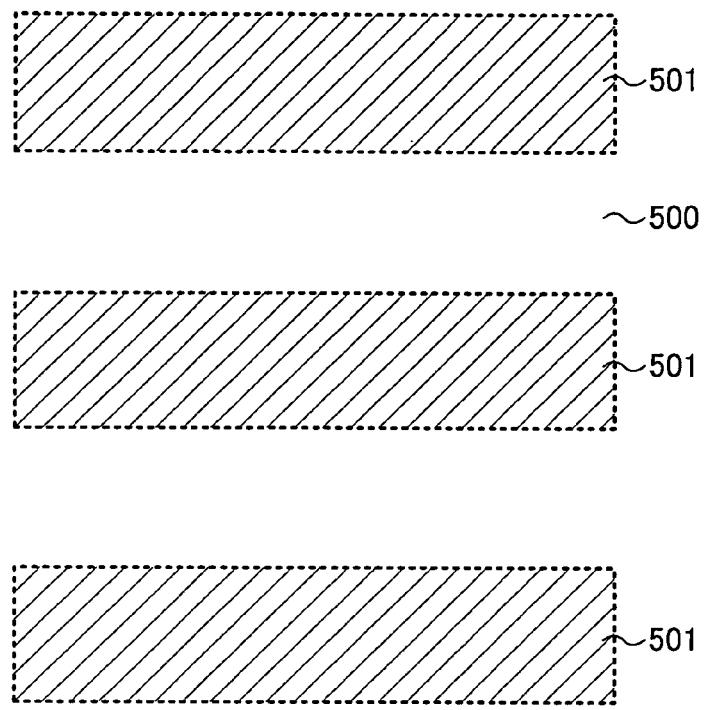
FIG. 8 is a plan view illustrating a mask layout for the cell array of the second embodiment of FIG. 6.
Figure 13:
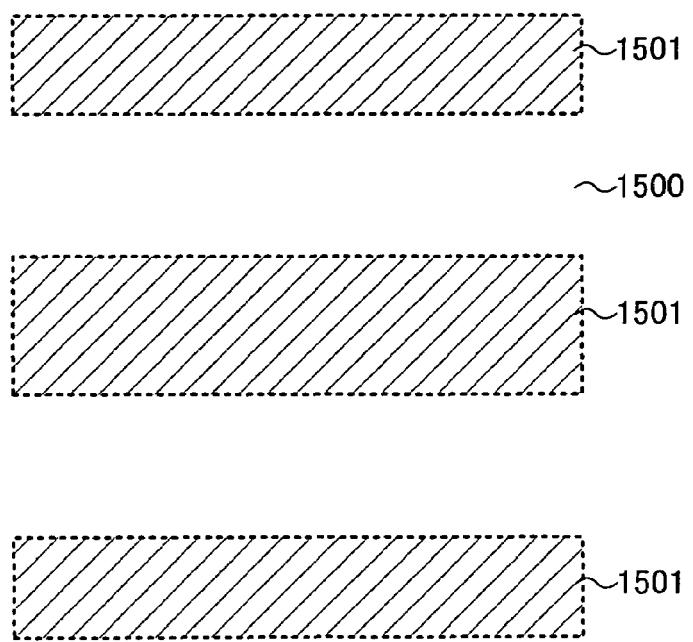
FIG. 13 is a plan view illustrating a mask layout for the conventional cell array of FIG. 12.

Here, FIG. 8 is a plan view illustrating a mask layout for the cell array of this embodiment of FIG. 6. FIG. 13 is a plan view illustrating a mask layout for the conventional cell array of FIG. 12. FIGS. 8 and 13 illustrate layouts of masks for forming N wells. Implantation portions 501 and 1501 correspond to the N wells 212 and 1212 of FIGS. 6 and 12, respectively. Resist portions 500 and 1500 correspond to the P wells 213 and 1213 of FIGS. 6 and 12, respectively.

Figure 9:
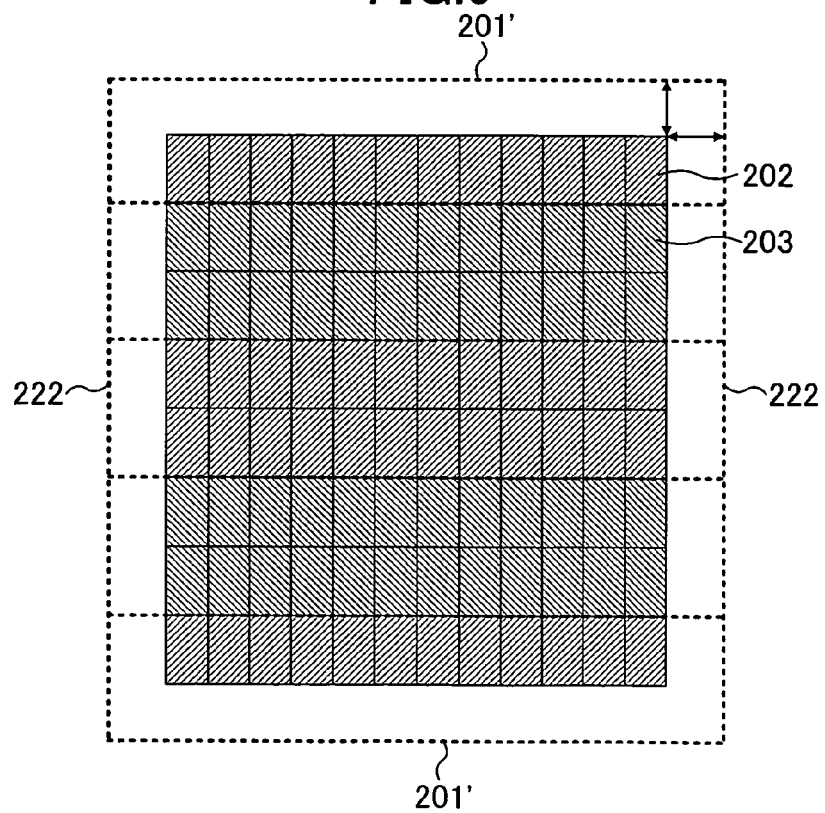
FIG. 9 is a plan view schematically illustrating a variation of the cell array layout of the semiconductor circuit device of the second embodiment.
Figure 10:
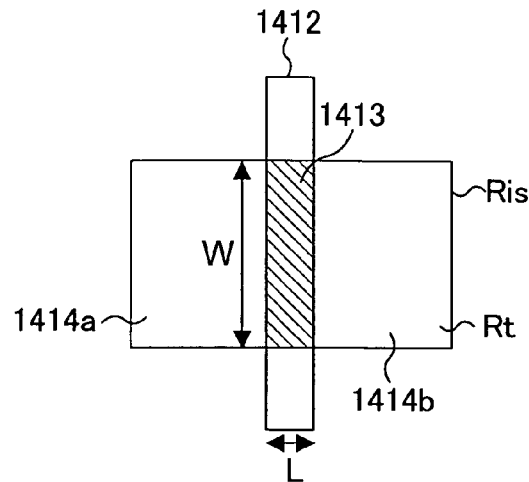
FIG. 10 is a diagram schematically illustrating a structure of a transistor for describing a conventional transistor model.

In the mask layout of this embodiment, a length in a length direction (gate width direction) of the resist portion 500 is substantially equal to a length in the length direction of the implantation portion 501 at end portions thereof. In contrast to this, in the conventional mask layout, a length in a length direction of the outermost implantation portions 1501 is shorter than a length in the length direction of the inner implantation portion 1501. Also, as illustrated in FIG. 9, in a cell array, a cell frame at both end portions in the leftward and rightward directions (gate length direction) is desirably extended in the same amount as that of the cell frame at both end portions in the upward and downward directions (gate width direction). A distance between the end portions (well ends 222) in the leftward and rightward directions of the cell frame and the PMIS active region 104 and a distance between the end portions (well ends 222) in the leftward and rightward directions of the cell frame and the NMIS active region 105, need to be sufficiently larger than the distance from the well boundary 101 to the PMIS active region 104 and the distance from the well boundary 101 to the NMIS active region 105, respectively, and preferably, need to be 1 µm or more.

In the cell array of this embodiment of FIG. 6, transistors at an end portion are not affected by a resist formed at the N well end 201'. Therefore, a variation in characteristics between inner transistors and outermost transistors in the cell array can be suppressed and made uniform. Also, as illustrated in FIG. 9, a distance from the cell regions 202 and 203 located at both end portions in the leftward and rightward directions to the well end 222, is designed to be similar to a distance from the cell region 202 at the end portion in the gate width direction to the N well end 201'. Thereby, the transistors located at both the end portions in the leftward and rightward directions can suppress the influence of resists provided in the leftward and rightward directions of the cell array, thereby making it possible to cause characteristics of the transistor to be more accurate and uniform.

As another method for designing a semiconductor circuit device, after a cell array as illustrated in FIG. 12 is laid out using a conventional technique, a dummy N well region 301 may be formed around an array as illustrated in FIG. 7. In the configuration of FIG. 7, by providing the dummy N well region 301, the N well region can be extended from the N well end 1201' of the conventional cell array in an amount corresponding to a width of the dummy N well region 301. Thereby, a distance from the cell region 202 at the end portion to the dummy N well end 301' can be set to be similar to the distance from the cell region 202 to the N well end 201' of FIG. 6. Also, by extending in a lateral direction, transistors located at both the end portions in the leftward and rightward directions can suppress the influence of resists provided in the leftward and rightward directions of the cell array. With such an arrangement, since all transistors in the cell array satisfy the conditions described in the first embodiment, higher design accuracy can be achieved. Also, by performing modeling with respect to the transistor fabricated in the first embodiment to extract a parameter, and using the parameter with respect to the cell array fabricated in the second embodiment, a high accurate design can be achieved. Note that a mask pattern for the cell array of FIG. 7 is as described in FIG. 8, as is similar to that of FIG. 6.

In summary, as a method for designing a cell array, there are a method of providing a dummy after fabrication of an array, and a design method of using cells each of which originally has an extended well frame. In the former, overlap between cells is small, so that a time required for a process, such as a DRC (Design Rule Check) or the like, is short. In the latter, a general design tool can be used to easily perform the method.

The design method of the present invention is applied to design of integrated semiconductor circuit devices, such as LSIs and the like.

What is claimed is:

1. A semiconductor circuit device comprising a cell array formation region made of cells which are arranged in an array, each cell having a first conductivity type MIS transistor and a second conductivity type MIS transistor, wherein in the cell array formation region, a plurality of first conductivity type first wells and a plurality of second conductivity type second wells are alternately arranged in a gate width direction, a distance between an outer end portion of each outermost well of the first wells and the second wells in the gate width direction in the cell array formation region, and an active region formed in the outermost well, is set to be larger than or equal to a predetermined value, an outermost well contact region is provided between the active region and the outer end portion of the outermost well, and a distance from a boundary line between the outermost well and another well adjacent thereto, to the outer end portion of the outermost well, is one time or more and two times or less larger than a distance from the boundary line to a center line of the outermost well contact region.

2. The semiconductor circuit device of claim 1, wherein the predetermined value is 1 μm.

3. The semiconductor circuit device of claim 1, wherein a distance from an end portion in the gate length direction of an outer frame of the cell to the active region is larger than a distance from the boundary line to the active region.

4. The semiconductor circuit device of claim 1, wherein a distance from an end portion in the gate length direction of an outer frame of the cell to the active region is 1 μm.

5. The semiconductor circuit device of claim 1, wherein
in a first well located further inside than the outermost well in the gate width direction in the cell array formation region, a first active region and a second active region opposed to each other in the gate width direction are provided, and a first well contact region is provided between the first active region and the second active region, and
a distance from a boundary line between the first well and the second well to an end portion in the gate width direction of the first well, is one time or more and two times or less larger than a distance from the boundary line to a center line of the first well contact region.

6. The semiconductor circuit device of claim 1, wherein the first conductivity type is an N type, and the second conductivity type is a P type.

7. A semiconductor circuit device in which a plurality of cells are arranged in an array, each cell having an N well and a P well formed in a substrate, a first PMIS active region formed in the N well, a first P-channel type transistor formed on the first PMIS active region and having a gate electrode, a first NMIS active region formed in the P well, a first N-channel type transistor formed on the first NMIS active region and having a gate electrode, a contact N-type region formed in the N well, and a contact P-type region formed in the P well, wherein
a distance from a boundary line between the N well and the P well to an end portion in a gate width direction of the N well, is one time or more and two times or less larger than a distance from the boundary line to a center line of the contact N-type region, and
a distance from the boundary line to an end portion in the gate width direction of the P well is one time or more and two times or less larger than a distance from the boundary line to a center line of the contact P-type region.

8. A semiconductor circuit device comprising a cell array formation region made of cells which are arranged in an array, each cell having a first conductivity type MIS transistor and a second conductivity type MIS transistor, wherein
in the cell array formation region, a plurality of first conductivity type first wells and a plurality of second conductivity type second wells are alternately arranged in a gate width direction,
of the first wells and the second wells, a distance between an outer end portion of each outermost well of the first wells and the second wells in the gate width direction in the cell array formation region, and an active region formed in the outermost well, is set to be larger than or equal to a predetermined value,
in a first well located further inside than the outermost well in the gate width direction in the cell array formation region, a first active region and a second active region opposed to each other in the gate width direction are provided, and a first well contact region is provided between the first active region and the second active region, and
a distance from a boundary line between the first well and the second well to an end portion in the gate width direction of the first well, is one time or more and two times or less larger than a distance from the boundary line to a center line of the first well contact region.

9. The semiconductor circuit device of claim 8, wherein the predetermined value is 1 μm.

10. The semiconductor circuit device of claim 8, wherein a distance from an end portion in the gate length direction of an outer frame of the cell to the active region is larger than a distance from the boundary line to the active region.

11. The semiconductor circuit device of claim 8, wherein a distance from an end portion in the gate length direction of an outer frame of the cell to the active region is 1 μm.

12. The semiconductor circuit device of claim 8, wherein the first conductivity type is an N type, and the second conductivity type is a P type.

* * * * *